(12) United States Patent
Angelis et al.

(10) Patent No.: US 7,918,102 B2
(45) Date of Patent: Apr. 5, 2011

(54) METHOD AND ARRANGEMENT FOR COOLING A SUBSTRATE, PARTICULARLY A SEMICONDUCTOR

(75) Inventors: Walter Georg Angelis, St. Georgen (DE); Wolfgang Laufer, Aichhalden (DE); Siegfried Seidler, Villingen-Schwenningen (DE)

(73) Assignee: Papst Licensing GmbH & Co. KG, St. Georgen (DE)

( * ) Notice: Subject to any disclaimer, the term of this patent is extended or adjusted under 35 U.S.C. 154(b) by 694 days.

(21) Appl. No.: 10/599,261

(22) PCT Filed: Mar. 17, 2005

(86) PCT No.: PCT/EP2005/002832
§ 371 (c)(1),
(2), (4) Date: Sep. 25, 2006

(87) PCT Pub. No.: WO2005/094150
PCT Pub. Date: Oct. 6, 2005

(65) Prior Publication Data
US 2007/0163274 A1   Jul. 19, 2007

(30) Foreign Application Priority Data
Mar. 26, 2004 (DE) .......... 10 2004 016 400

(51) Int. Cl.
*F25D 23/12* (2006.01)
(52) U.S. Cl. ............................................. 62/259.2
(58) Field of Classification Search .......... 62/259.2, 62/418, 498
See application file for complete search history.

(56) References Cited

U.S. PATENT DOCUMENTS

| | | | |
|---|---|---|---|
| 4,311,192 A * | 1/1982 | VanderVaart | 165/240 |
| 4,450,896 A | 5/1984 | Opitz et al. | |
| 4,912,600 A | 3/1990 | Jaeger et al. | 361/385 |
| 5,183,104 A | 2/1993 | Novotny et al. | 165/104.33 |
| 5,471,850 A * | 12/1995 | Cowans | 62/223 |
| 6,034,872 A * | 3/2000 | Chrysler et al. | 361/699 |
| 6,208,512 B1 | 3/2001 | Goldowsky et al. | 361/699 |
| 6,327,145 B1 | 12/2001 | Lian et al. | 361/697 |
| 6,549,408 B2 | 4/2003 | Berchowitz et al. | 361/700 |

(Continued)

FOREIGN PATENT DOCUMENTS
DE   32 06 059   9/1983
(Continued)

OTHER PUBLICATIONS

Kraus+, abs. of "Transport Properties 1,1,1,2 Tetrafluorethane (R134a)", Int'l Journal of Thermophysics, vol./Issue: 14:4 (Jul. 1, 1993).

(Continued)

*Primary Examiner* — Melvin Jones
(74) *Attorney, Agent, or Firm* — Husch Blackwell LLP

(57) ABSTRACT

In this method, a refrigerant (52) is compressed (32) in a refrigerating circuit, then condensed by cooling in a condenser (44), then expanded in a throttle valve (62) and delivered in the expanded state, in the form of wet vapor (52), to an evaporator (60) that is in thermally conductive contact with a substrate (12) to be cooled. The cooling process thus operates similarly to a liquid cooling process, but with a higher mean logarithmic heat transfer temperature difference, which allows lower temperatures of the substrate (12) to be achieved and makes possible a better heat transition coefficient, since the refrigerant is present as wet vapor. A corresponding arrangement is likewise described.

27 Claims, 6 Drawing Sheets

U.S. PATENT DOCUMENTS

| | | | |
|---|---|---|---|
| 6,587,343 B2 | 7/2003 | Novotny et al. | 361/698 |
| 6,679,081 B2 | 1/2004 | Marsala et al. | 62/259.2 |
| 2002/0075652 A1 | 6/2002 | Berchowitz | 361/700 |
| 2002/0163782 A1 | 11/2002 | Cole et al. | 361/700 |

FOREIGN PATENT DOCUMENTS

| | | |
|---|---|---|
| DE | 43 30 923 | 3/1995 |
| DE | 43 30 925 | 3/1995 |
| DE | 203 16 173 U | 3/2005 |
| WO | WO 91-15722 | 10/1991 |

OTHER PUBLICATIONS

Advanced Gas Technologies, Inc., "R600a-Isobutane C4H10" retrieved Sep. 24, 2006 from webpage WWW.ADVGAS.COM/VIEW_PRODUCT.ASP?productID=29 (2 pages).

\* cited by examiner

_US 7,918,102 B2_

METHOD AND ARRANGEMENT FOR COOLING A SUBSTRATE, PARTICULARLY A SEMICONDUCTOR

CROSS-REFERENCES

This application is a section 371 of PCT/EP2005/002832, filed 17 Mar. 2005, published 5 Oct. 2005 as WO 2005/094150-A1. Priority is claimed from our German application DE 10 2004 016 400.2, filed 26 Mar. 2004, the entire content of which is incorporated by reference.

FIELD OF THE INVENTION

The invention relates to a method and an arrangement for cooling a substrate. A semiconductor, e.g. a microprocessor, microcomputer, or the like, preferably serves as a substrate to be cooled.

BACKGROUND

A cooling arrangement for a CPU is known from U.S. Pat. No. 6,549,408 B2, BERCHOWITZ. Disposed on this arrangement is an evaporator, and coolant in this evaporator is evaporated by the heat of the CPU and thereby flows upward in a riser conduit to a condenser that is arranged at a higher geodetic level. The vapor is cooled and liquefied there, and flows in response to gravity through a downpipe back to the evaporator, where it is evaporated again.

The advantage of such an arrangement is that it operates quietly; a disadvantage, however, is that, according to the second law of thermodynamics, it is impossible in this case to achieve a coolant temperature lower than the ambient temperature, since heat flows only from a higher-temperature medium to a lower-temperature medium. What is obtained instead is a coolant temperature that, because of the temperature gradient necessary for heat transfer, is at least 7 to 10° K (=Kelvin) above ambient temperature; this limits heat dissipation from the CPU, especially on hot days. The overall efficiency of such a system is moreover not good.

SUMMARY OF THE INVENTION

It is therefore an object of the invention to make available a novel method and a novel arrangement for cooling a substrate.

According to the invention, this object is achieved by the method of compressing a refrigerant in a refrigeration loop, feeding the compressed refrigerant through a condenser, subjecting the condensed refrigerant to an expansion step to reduce its pressure and temperature, turning it into boiling liquid and wet vapor, applying the boiling liquid and wet vapor to a heat transfer surface in thermal contact with a substrate to be cooled, and returning the refrigerant again to the compression step. What is achieved thereby is that the refrigerant is present at the heat transmission surface of the evaporator substantially in the form of a boiling liquid on which wet vapor is superimposed, thus resulting in outstanding heat transmission that is even better than with liquid cooling; lower substrate temperatures can also be achieved because of the greater average logarithmic heat transfer temperature difference that is possible here. No substantial temperature differences occur in the refrigerant in the evaporator, i.e. only a slight superheating of the refrigerant takes place during heat transfer from the substrate to the refrigerant, since what is transferred is almost exclusively latent heat (resulting from a phase change). This ensures a largely uniform and low evaporator temperature, and therefore also a correspondingly uniform and low temperature for the substrate to be cooled. This makes possible a high cooling capacity in a small space.

Another manner of achieving the stated object is evident from a cooling arrangement in which the refrigeration loop includes a compressor, a condenser for transferring heat to ambient air, a fan to assist this heat transfer, a nozzle for isenthalpic expansion of the refrigerant, an evaporator receiving the expanded refrigerant and applying it to a heat sink in thermal contact with the substrate to be cooled, and a controller for monitoring the refrigerant temperature and regulating it by controlling the rotation speed of a motor driving both the compressor and fan. A cooling arrangement of this kind can be designed in very compact and efficient fashion, and is therefore very suitable, for example, for servers and similar applications.

BRIEF FIGURE DESCRIPTION

Further details and advantageous refinements of the invention are evident from the exemplifying embodiment, in no way to be understood as a limitation of the invention, that is described below and depicted in the drawings. In the drawings.

Figure 1:
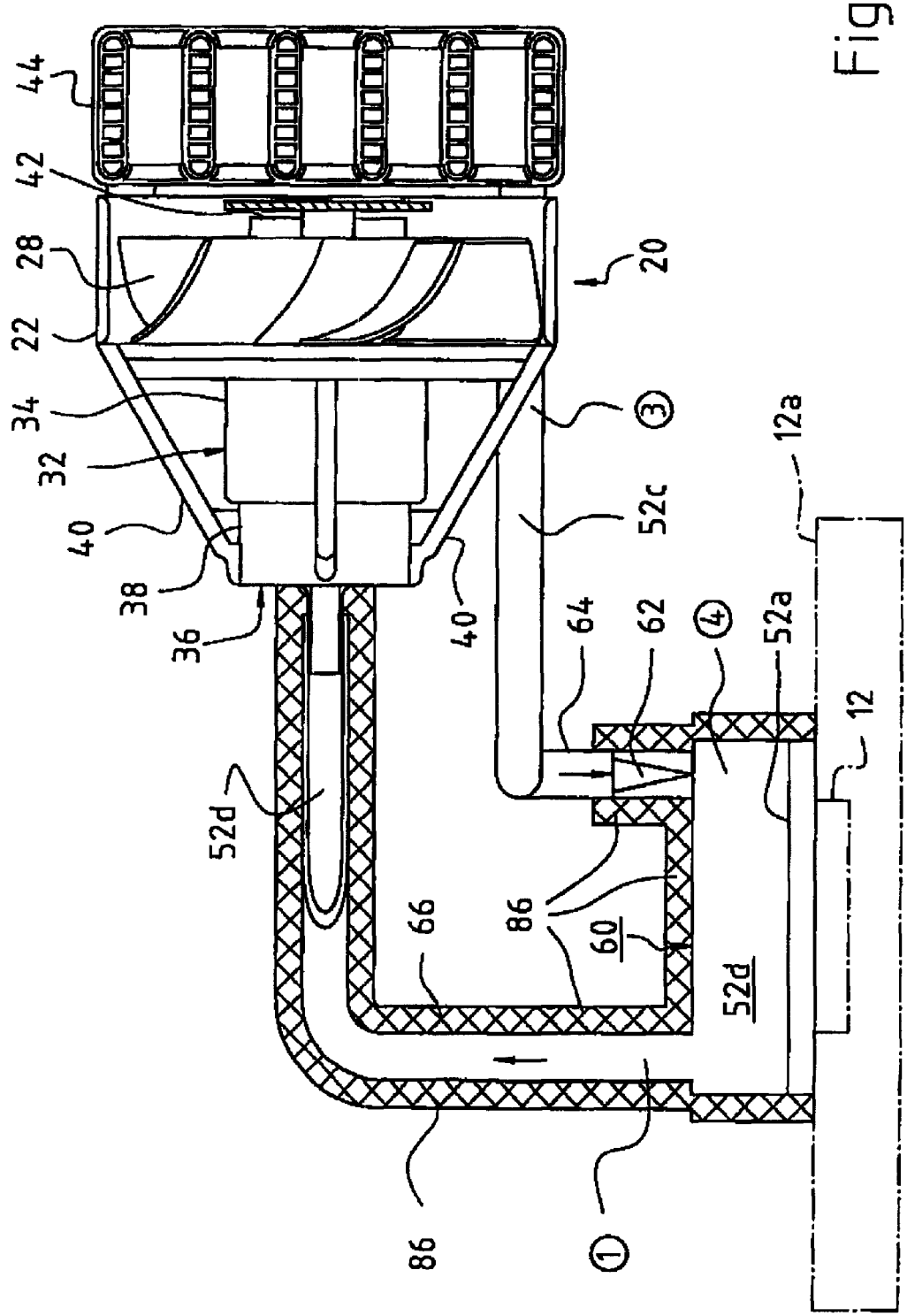
FIG. 1 depicts an exemplifying embodiment of a refrigerating arrangement according to the present invention, viewed along line I-I of FIG. 2.
Figure 2:
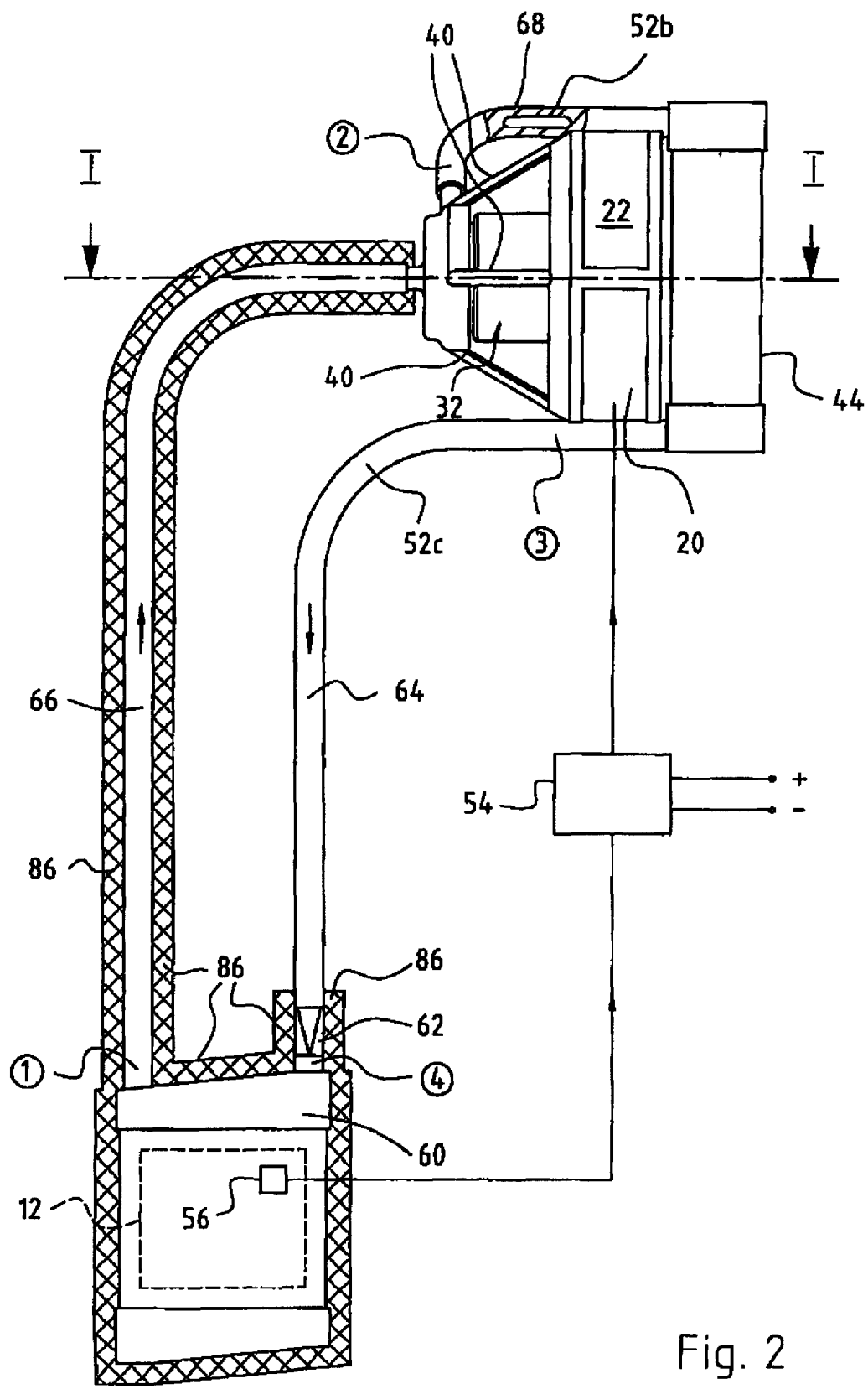
FIG. 2 is a different depiction of the arrangement according to FIG. 1.
Figure 3:
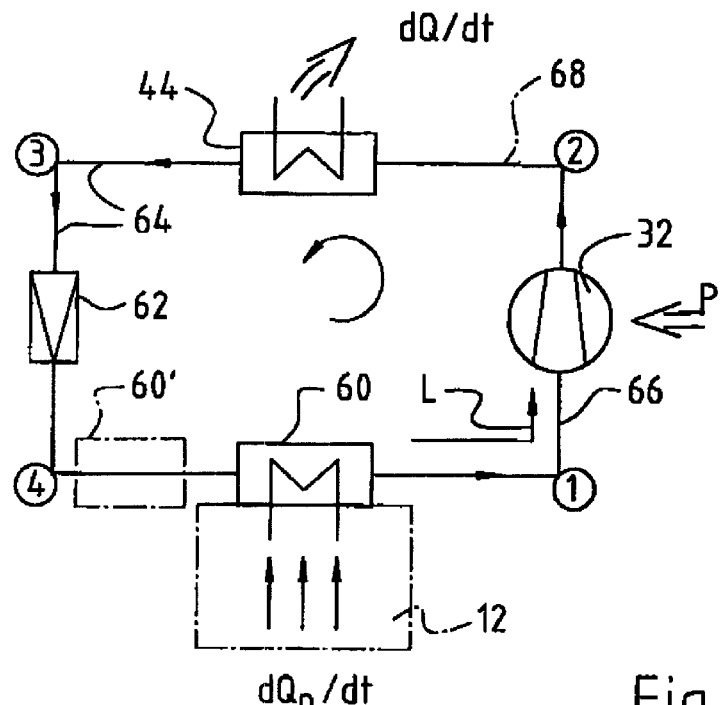
Figure 4:
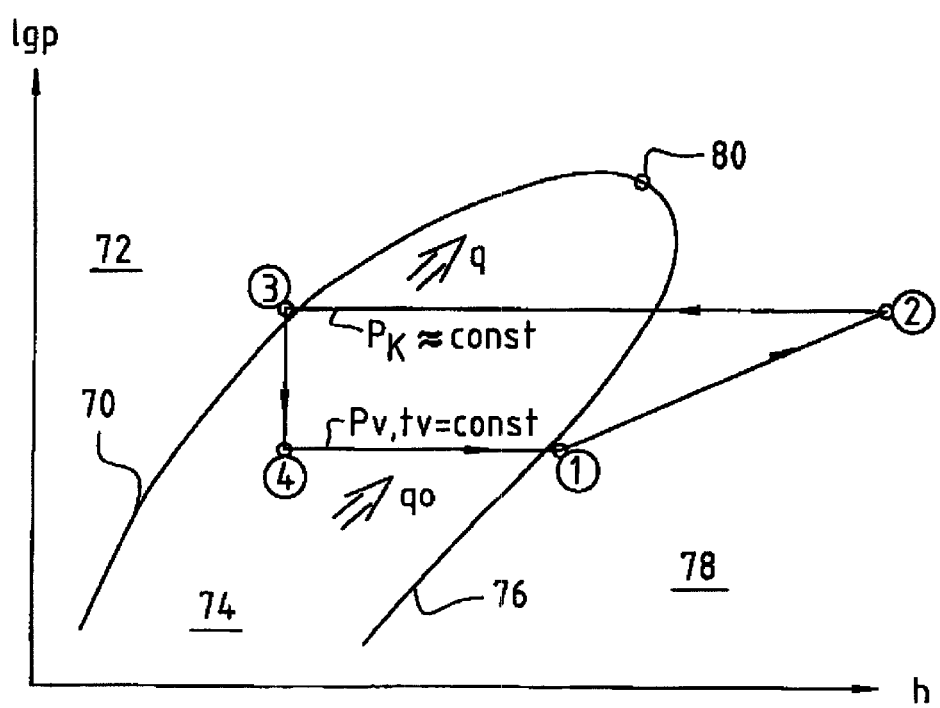
Figure 5:
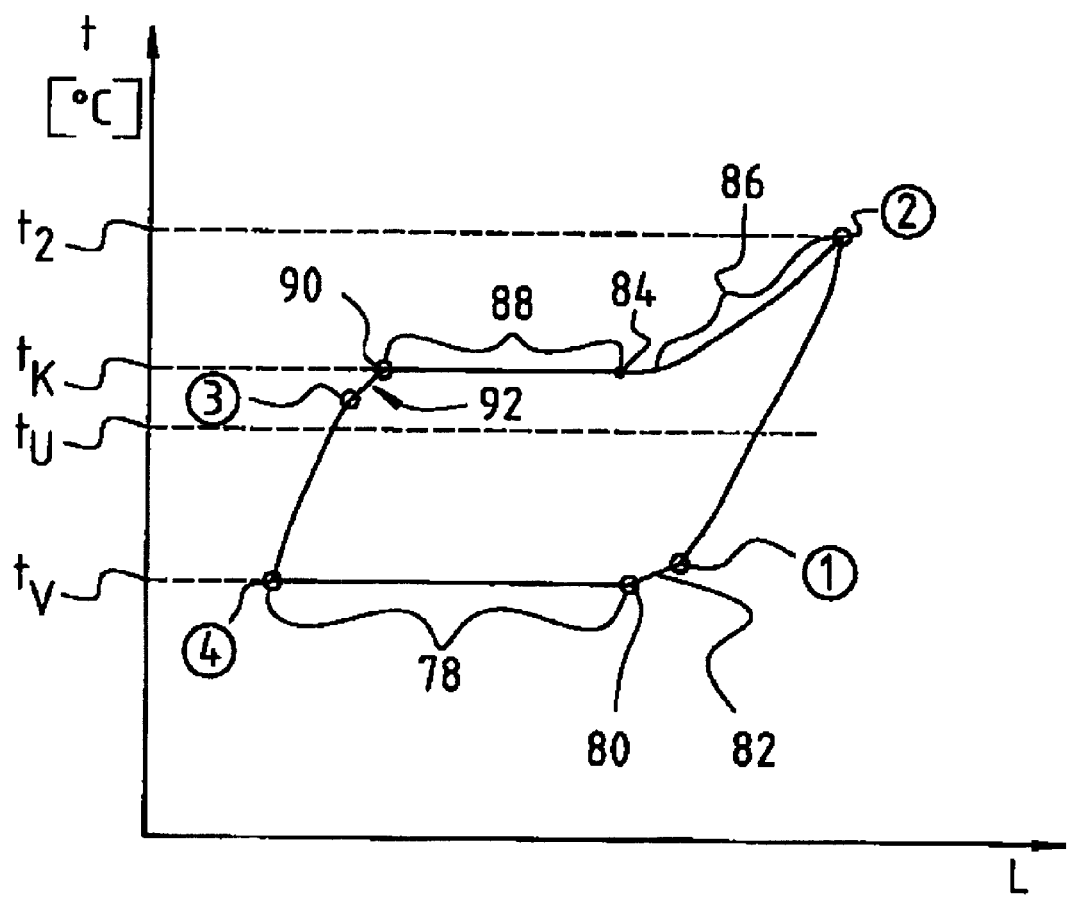
Figure 6:
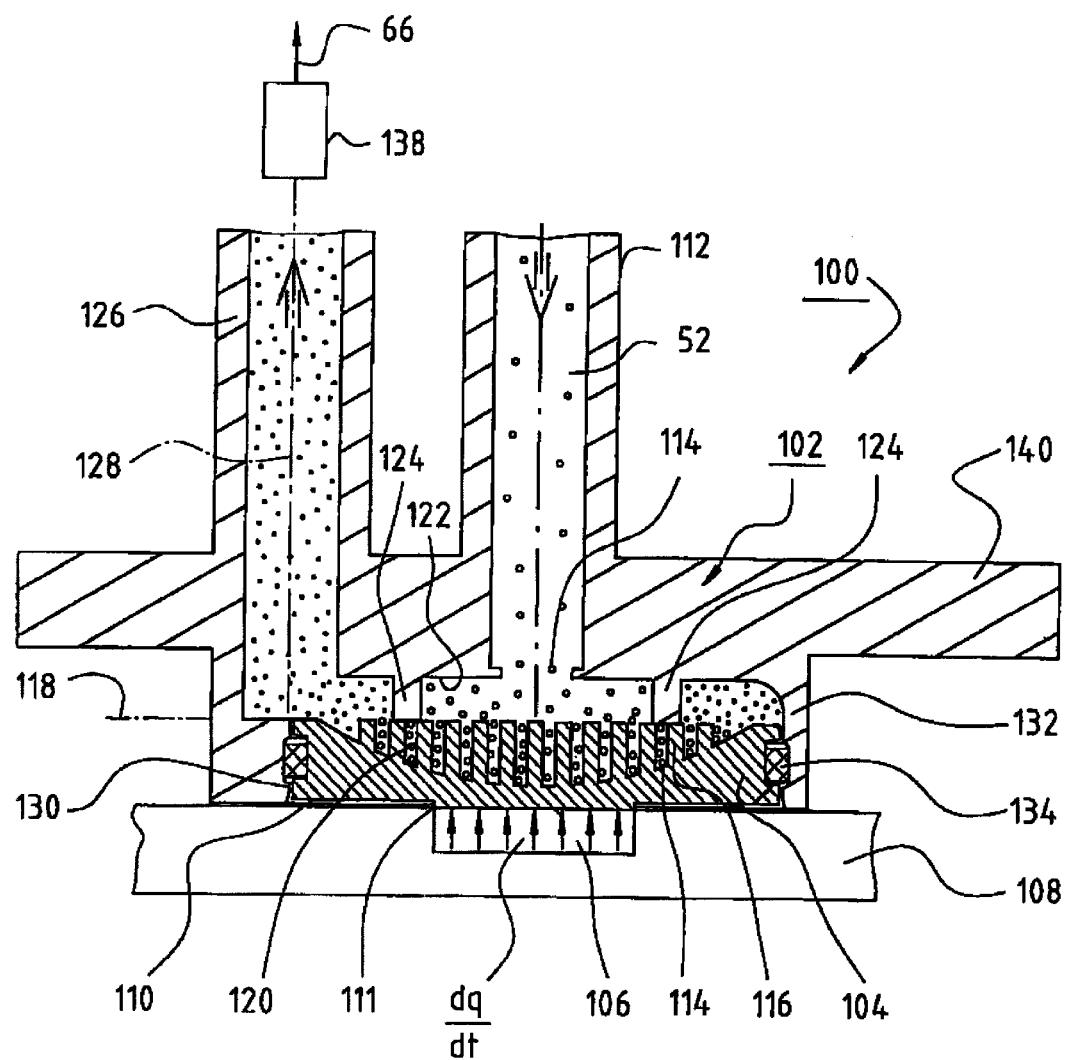
Figure 7:
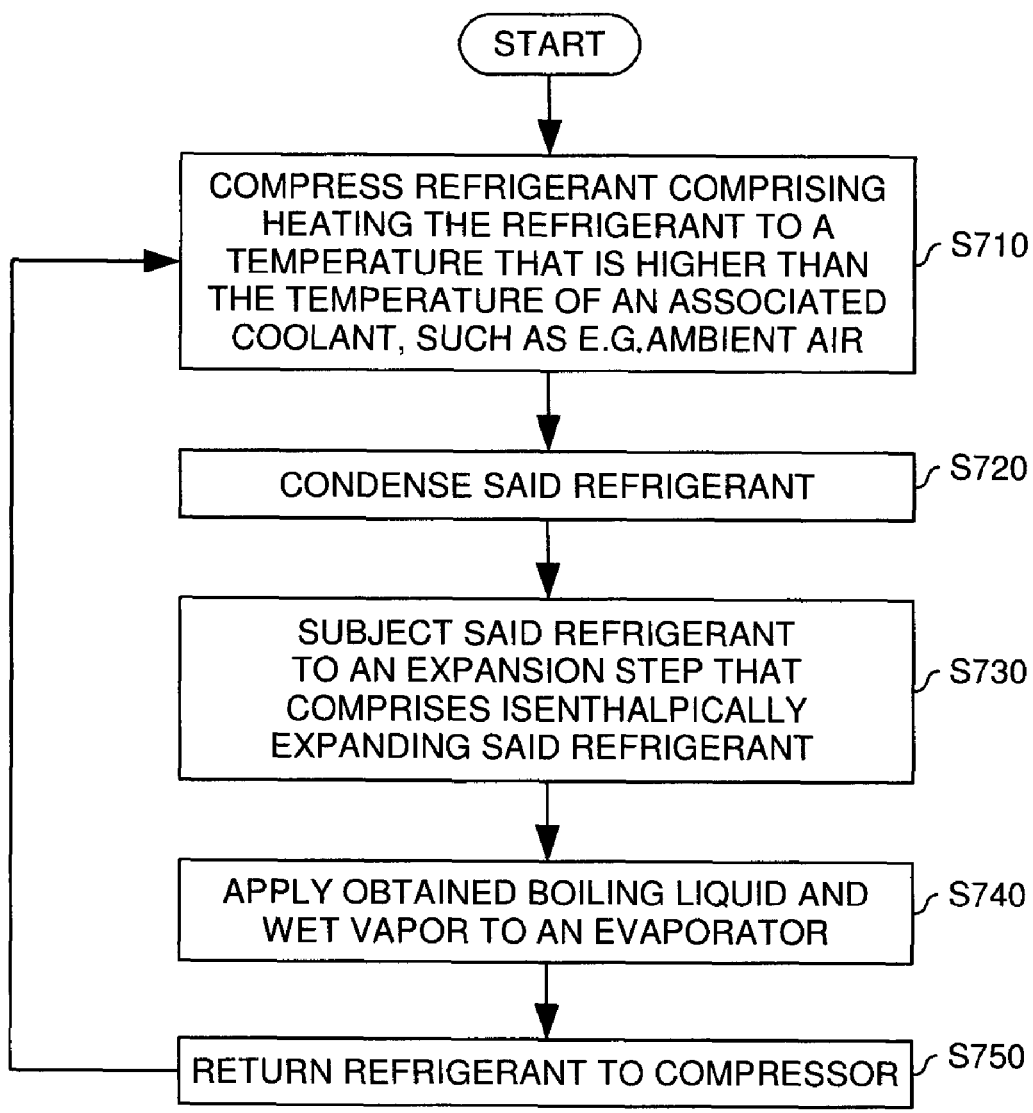

FIG. 3 schematically depicts the refrigeration circuit in the arrangement according to FIGS. 1 and 2;

FIG. 4 depicts the circular process using refrigerant in a log-p/h diagram, a considerably improved heat flow from the substrate to the refrigerant being possible;

FIG. 5 is a diagram showing the change in temperature in the course of the circular process;

FIG. 6 is a section through a preferred embodiment of a high-performance evaporator that can be operated in position-independent fashion; and FIG. 7 is a flowchart illustrating an embodiment of the method of the invention.

DETAILED DESCRIPTION

FIG. 1 schematically shows a section through a preferred embodiment of a cooling apparatus according to the invention. Indicated schematically in FIGS. 1 and 2 is a component 12 to be cooled, e.g. a microprocessor, whose heat produced during operation is to be discharged at a low, uniform temperature so as to enable, in a compact design, reliable operation and a long service life in a context of high heat output. Component 12 is usually arranged in a carrier 12a that serves for electrical connection.

Fan 20 has a fan housing 22, a stator 26 mounted thereon via a plurality of spokes 24, and a rotor 28 having fan blades.

A refrigerant compressor 32 has a magnet cup 34 joined to rotor 28 of fan 20, also a compressor housing 36 and a schematically indicated compressor rotor 38, as well as a drive motor 42, preferably a controllable-speed brushless motor.

Compressor housing 36 is joined via a retaining spider 40 to fan housing 22 to form one assembly. Alternatively, compressor 32 can be arranged on the opposite side of fan 20, i.e. its flange side.

A condenser 44 is connected, in the side opposite compressor 32, to the assembly constituted by fan 20 and compressor 32, so that the air delivered by fan 20 flows through condenser 28 and cools it. Alternatively, condenser 44 could also be arranged on the same side as compressor 32.

Compressor 32 is driven by rotor 28 of fan 30 via magnet cup 34 (magnetic coupling). (Alternatively, fan rotor 28 can be driven, via a magnetic coupling, by the rotor of a drive motor for compressor 32.) Magnet cup 34 is fixedly joined to rotor 28. Compressor housing 36 is retained by retaining spider 40 so that it cannot rotate along with magnet cup 34. Compressor rotor 38 is rotatably journalled in housing 36. Magnet cup 34 is likewise journalled by compressor housing 36.

When magnet cup 34 is rotated by motor 42 of fan 20, compressor rotor 38 is thus also moved and causes compression of refrigerant 52.

The cooling apparatus preferably has a rotation speed controller 54 (FIG. 2) to regulate the rotation speed of fan 20 and/or compressor 32. The target rotation speed for the rotation speed controller is preferably determined as a function of a temperature value that is ascertained by means of a temperature sensor 56 that can be arranged, for example, on component 12.

Compressor 32 draws in saturated refrigerant vapor 52d, or slightly superheated vapor, from an evaporator 60 through a conduit 66. As a result, the necessary evaporation enthalpy $q_0$ is withdrawn from refrigerant 52 in evaporator 60 (cf. FIG. 4). A further delivery of evaporation enthalpy $q_0$ occurs by means of the heat output of substrate 12 to be cooled, e.g. a microprocessor to be cooled. Evaporator 60 is preferably somewhat larger than substrate 12.

Be it noted that evaporators 60, 60' in FIGS. 1 and 2 are depicted only in highly schematic form, as is useful for an understanding of the invention.

FIG. 1 shows the manner in which a stratification occurs in practical use in evaporator 60; i.e. at the latter's base and directly above component 12 to be cooled, boiling refrigerant 52a, i.e. a liquid, is present at least in certain regions (similarly to boiling water in a pot), and above it lies wet vapor 52d, comparable to the wet steam in and above boiling water. Superheated vapor may occasionally also be present locally, for example in the context of very strong local heat evolution in substrate 12.

Because the refrigerant is present at the heat transfer surface of evaporator 60 principally as a boiling liquid 52a that has everywhere the same pressure $p_v$ and therefore (since it is in the wet-vapor region) also the same temperature $t_v$, the heat transition coefficient k is also very good and is substantially the same over the entire heat transfer area. Because the temperature $t_v$ (and evaporator pressure $p_v$) in evaporator 60 can also be selected to be low, e.g. –10° C., very good cooling of substrate 12 is obtained. In this context, $t_v$ can preferably be regulated to a predetermined value, e.g. to –10° C., to allow e.g. a continuously high clock frequency in a processor 12.

The cooling of substrate 12 can be further improved by designing evaporator 60 appropriately, e.g. by providing, in its interior, cooling ribs or the like which enlarge the heat transfer area and/or increase turbulence (cf. FIG. 6 below in this connection).

Because the temperature of substrate 12 is usually highest at its center, it can be very advantageous to deliver the refrigerant to the center of evaporator 60 and extract it to compressor 32 at the edge of evaporator 60. These special features are depicted in FIG. 6. Be it noted here that there are numerous advantageous configurations for such evaporators, which configurations can advantageously be used within the scope of the invention in order to achieve a particularly compact design and high-efficiency cooling.

During cooling, a temperature gradient is created between substrate 12, evaporator 60, and refrigerant 52a, 52d in evaporator 60. To achieve a very high heat flux density dQ/dt with very small heat transfer areas, the temperature gradient is increased by reducing the temperature in the heat absorber, i.e. in this case the temperature of refrigerant 52a, 52d in evaporator 60, as far as is necessary; the maximum microprocessor temperature is of course limited depending on its type, so that increasing the temperature gradient by increasing the temperature of the microprocessor usually does not represent a practical alternative.

The use of a refrigerant circuit such as the one depicted schematically in FIGS. 3 to 5 allows a temperature $t_v$ of, for example, –10° C. to be obtained in evaporator 60 with an ambient temperature of +30° C., in other words a very steep temperature gradient and consequently a very high heat flux even with small transfer areas. This is explained once again below with reference to equation (1).

Compressor 32 compresses the aspirated refrigerant 52d to a condensation pressure $p_K$, thus yielding at its outlet a temperature $t_2$ (FIG. 5) that is well above the respective ambient temperature $t_U$ (FIG. 5). The compressed, superheated refrigerant 52b (FIG. 2) is guided via a conduit 68 to condenser 44 and through it, so that it can lose heat therein and condense.

Fan 20 blows or draws air (at ambient temperature $t_U$) through the air side of condenser 44, and this air cools condenser 44 and therefore also the superheated refrigerant 52b in it. Sufficient heat q (cf. FIG. 4) is withdrawn from refrigerant 52b that it completely condenses and may, if applicable, even be slightly subcooled, for example by 5° K. The refrigerant condensate is labeled 52c. It is still approximately at the high condensation pressure $p_K$ (FIG. 4), i.e. point 3 of FIGS. 3 and 4, which is associated with a correspondingly high temperature $t_K$ of, for example, 45° C. This condensate 52c is delivered via conduit 64 to a throttle valve 62 and expanded therein isenthalpically, i.e. at a substantially constant enthalpy, to the evaporation pressure $p_V$ (cf. point 4 in FIG. 4). Associated with this evaporation pressure $p_V$ is a correspondingly low evaporator temperature $t_V$ of, for example, –10° C., as used for cooling substrate 12.

Instead of a single evaporator 60, for example, two evaporators 60, 60' can be used that preferably are connected in parallel but can also be connected in series (cf. FIG. 3).

FIG. 3 schematically depicts the refrigeration circuit as a "circuit diagram." Because a refrigerant 52 is used, e.g. 1,1,1,2-tetrafluoroethane (commercial designation H-FKW 134a or R 234a) or, for example, the refrigerant R600a, this agent is present in the circuit according to FIG. 3 in two phases, namely gaseous and liquid. In evaporators 60, 60', refrigerant 52 is present as a wet vapor (made up of boiling liquid 52a and saturated vapor, in some cases also with slightly superheated vapor). In condenser 44, the refrigerant is present as superheated vapor and as wet vapor, and as subcooled liquid. These are, in FIGS. 3 and 4, the segments between the points labeled 2 and 3 (condenser 44) and 4 and 1 (evaporator 60). A segment at a substantially constant pressure $p_K$ occurs between points 2 and 3. A considerably improved heat transmission from evaporator 60, 60' to refrigerant 52a therein (i.e. an improved α) is therefore achievable, and thus a considerably higher heat flux density, in particular from heat source 12 to evaporator(s) 60, 60', with no change in the temperature of heat source 12.

An isenthalpic change of state occurs in throttle 62 (cf. the vertical line between points 3 and 4 in the diagram of FIG. 4), i.e. no energy is delivered or removed, but the pressure and temperature of the refrigerant are simply reduced to the lower level in evaporator 60. The aggregate state of the subcooled refrigerant condensate 52c likewise changes in this context, from subcooled liquid (point 3 in FIGS. 3 and 4) to wet vapor (point 4 in FIGS. 3 and 4). This is therefore, as depicted in FIG. 4, a counterclockwise circular process. The letter h therein designates the enthalpy measured in kJ per kg of refrigerant, and the letter p designates the pressure in bar.

In FIG. 4, 70 designates the boiling line that separates a region 72 of pure liquid from a wet-vapor region 74. The dew line, which separates region 74 from hot-vapor region 78, is labeled 76. The so-called critical point is labeled 80. In the region above this point 80, a precise separation between liquid and hot vapor is no longer possible. The associated critical temperature consequently limits the range of application of the selected refrigerant.

The temperatures of evaporators 60, 60' can be varied in this context, and can even be decreased below the ambient temperature. A further considerable increase in the heat flux density from heat source 12 to an evaporator 60, 60' is thereby achievable, with no need to raise the temperature of heat source 12 for that purpose. If the evaporator temperature $t_V$ is decreased below the dewpoint temperature of the ambient air, thermal insulation 86 of the cold components—i.e., as depicted, of throttle valve 62, evaporator 60, and connecting conduit 66 to compressor 32—is useful. This prevents water from condensing out of the ambient air onto the cold components, which could result in difficulties with electrical parts.

Refrigerant 52a, 52d is present in evaporator 60 at a substantially constant temperature, i.e. during heat transfer no substantial temperature gradient occurs in refrigerant 52 itself except for a slight superheating (equivalent to, for example, 5° K) in evaporator 60, since what is transferred here is almost exclusively latent heat (phase change). A largely uniform and low temperature is thereby ensured for evaporator 60, 60', as is desirable for reliable cooling of semiconductor substrates. Also contributing to this is the fact that, as depicted in FIGS. 1 and 6, the heat transfer surfaces of evaporators 60 and 100 are covered mainly with boiling liquid 52a.

FIG. 5 shows the change in temperature as a function of travel L through the refrigeration circuit. The travel L is plotted symbolically in FIG. 3, and is based on the idea that an observer is traveling along with the refrigerant and finally arrives back at his starting point. This is a type of illustration that is commonly used for such systems. Points 1, 2, 3, and 4 are the same as those indicated in the preceding Figures.

At point 4, namely the inlet into evaporator 60, 60', the refrigerant is at its lowest temperature $t_V$ (evaporator temperature), e.g. −10° C., i.e. it is present chiefly as wet vapor, which is very favorable for heat transfer. "Wet vapor" is understood to be a mixture of boiling liquid and saturated vapor. An illustrative instance of wet vapor is a pot of boiling water at standard atmospheric pressure. The boiling water stays at its temperature of 100° C. until it has completely evaporated. Now consider FIG. 5: here, in the same fashion, the refrigerant stays at this temperature $t_V$ of, for example, −10° C. in a region 78 until it reaches a point 80, namely its dew line; and in the region 82 between point 80 and point 1, a slight superheating of the wet vapor can take place (equivalent to, for example, 5° K), with the result that the temperature of the refrigerant can rise somewhat in this region 82. Because the refrigerant is present here substantially as wet vapor, the heat transition coefficient k is elevated (cf. equation (1) below and the explanations thereof).

Between points 1 and 2, compressor 32 is effective, causing at point 2 a corresponding rise in pressure and temperature, the latter reaching its maximum $t_2$ at the outlet of compressor 32. There the refrigerant is present as a compressed superheated vapor.

Between points 2 and 3, the refrigerant flows through condenser 44. There it is cooled so that its temperature first drops, between point 2 and a point 84 (i.e. where the dew line is reached) in a region 86, to the condensation temperature $t_K$. Because of the continued heat discharge as a result of cooling in condenser 44, complete condensation of the refrigerant occurs between points 84 and 90 until boiling line 90 is reached, a corresponding quantity of heat q (FIG. 4) being withdrawn from the refrigerant. A slight subcooling of the refrigerant (equivalent to, for example, 5° K) can also occur between points 90 and 3 in a region 92.

Be it noted that the condensation temperature $t_K$ is considerably (e.g. 10° K) above the ambient temperature $t_U$; this correspondingly improves heat transmission from condenser 44 to the ambient air (cf. FIG. 5).

Between points 3 and 4, the condensed refrigerant flows through throttle 62, and at the latter's outlet, the agent's temperature has dropped back to the evaporator temperature $t_V$, which can be, for example, −10° C. and remains practically constant in evaporators 60, 60' in region 78 for the reasons explained; at most, a slight temperature rise of 5° K can occur in region 82 as a result of superheating. This enables excellent heat transmission from processor 12 to refrigerant 52, since a higher and substantially constant temperature gradient exists at processor 12, so that cooling is equally good everywhere. If processor 12 is at, for example, a temperature of +60° C., and the refrigerant has an evaporator temperature $t_V$ of −10° C., the result is a substantially constant temperature gradient of 70° K, which enables excellent cooling, even in a small volume.

It is very advantageous that a low temperature exists practically only between points 4 and 1 of the refrigeration circuit, i.e. thermal insulation 86 is necessary only in this region, but not on condenser 44 or compressor 32. This is a consequence of the fact that condenser 44 operates at a condensation temperature $t_K$ that is, for example, +45° C. or higher. Even with a slight subcooling of 5° K in region 92, the temperature there can still be kept at +40° C., i.e. above the dewpoint temperature of the ambient air, so that no condensation of moisture from the air can occur there. This emerges as a very important factor specifically in arrangements for cooling electronic components, since moisture that has condensed out onto them could cause malfunctions.

Expressed mathematically, the heat flux to be transferred is calculated as:

$$dQ/dt = k*A*\Delta\theta m \qquad (1),$$

in which:
  dQ/dt=heat flux in W,
  k=heat transition coefficient in W/m²K,
  A=heat transfer area in m²,
  Δθm=mean logarithmic heat transfer temperature difference In the context of the invention, heat transfer area A has a fixed value. A considerable increase in heat flux dQ/dt is obtained, in the invention, thanks to the following factors:
  a) the heat transition coefficient k is greatly increased because heat is transferred substantially in the wet-vapor region.
  b) the mean logarithmic temperature difference Δθm is greatly increased because the evaporator temperature can be lowered to well below ambient temperature, even with no change in the temperature of substrate 12 or 106 (FIG. 6).

FIG. 6 is a section through an advantageous evaporator 100. As a result of its construction, this can be operated in a substantially position-independent fashion. It works on the principle of an impact plate in order to achieve a high heat flux density.

Evaporator 100 has an upper part 102 that is usually manufactured, in one piece and as an injection-molded part, from a suitable plastic, and it has a refrigerating plate 104 made of a suitable metal, usually copper, that is implemented for contact against a heat-generating substrate 106 that is arranged in a carrier 108 (for the electrical connections of substrate 106). Refrigerating plate 104 can be manufactured, for example, as a cold-extruded part made of copper, aluminum, silver, or the like. This allows refrigerating plate 104 to be manufactured simply and economically, whereas the upper part can have a more complex configuration and is nevertheless easy to manufacture.

Refrigerating plate 104 has a heat-transferring surface 110 that has a high surface quality and rests over its entire surface against substrate 106, some thermoconductive paste 111 usually being inserted between surface 110 and substrate 106. The heat delivery dq/dt from substrate 106 is depicted symbolically by arrows, in order to illustrate the heat flux.

Upper part 102 has, at its center 112, a delivery conduit 112 at whose lower end nozzles 114 are preferably located. Expanded refrigerant 52 is delivered through delivery conduit 112 as wet vapor, and is sprayed through nozzles 114 onto refrigerating plate 104. This causes an increase in turbulence and an additional improvement in heat transmission from refrigerating plate 104 to refrigerant 52. Nozzles 114 can be, for example, orifice nozzles or slit nozzles.

Refrigerating plate 104 has a dish-shaped depression 114 having, for example, the outline of a spherical shell, a paraboloid of rotation, a bowl, or the like. From this depression 114, needle-shaped cooling elements 116 project upward, as far as a plane 118 that extends parallel to surface 110, as FIG. 6 clearly shows. Cooling elements 116 can also be implemented, as necessary, as ribs or the like, as is known to one skilled in the art, and their height can be varied.

Located between the needle-shaped cooling elements 116 are cooling channels 120, and wet vapor 52 is sprayed into these in the manner of an impinging flow, thus resulting in good heat transmission. The impinging flow makes it possible to achieve, in a very small space, a very high heat flux density that can be increased even further by the low refrigerant temperature. Nozzles 114 make possible a vena contracta (Coanda effect) that likewise contributes to an improvement in heat transfer.

As is evident, it is irrelevant whether evaporator 100 according to FIG. 6 is exactly horizontal or is in a slightly oblique position, since this results in no substantial change in the heat transfer from refrigerating plate 104 to wet vapor 52. This represents a great advantage of the arrangement according to FIG. 6, since in practical use it cannot be expected that, for example, a computer of which microprocessor 106 is a component will be set up entirely horizontally.

Arranged approximately concentrically with delivery conduit 112, on underside 122 of upper part 102, is an annular baffle 124 that projects downward and preferably rests against the upper ends of cooling elements 116 there, or indeed protrudes slightly into channels 120. Wet vapor 52 is thereby forced to flow from the center through channels 120 radially outward in all directions, which additionally improves heat transfer. Without baffle 124, wet vapor 52 would flow, for the most part, directly from inlet 112 to an outlet channel 126, and not in between cooling elements 116.

Outlet channel 126 is provided in upper part 102. Its center axis 128 extends approximately so that it extends through outer rim 130 of the (preferably circular) refrigerating plate 104.

Upper part 102 has an extension 132 that extends downward in approximately tubular fashion and approximately concentrically with inlet 112; in this extension 132, refrigerating plate 104 is mounted in sealed fashion, e.g. by means of a peripheral seal 134 or by adhesive bonding, welding, soldering, or the like.

When wet vapor 52 flows through channels 120 between cooling elements 116, it evaporates, so that saturated vapor 52 or superheated vapor emerges through outlet 126. A drier 138 is usually placed downstream in order to separate out entrained liquid particles, since they might damage compressor 32.

Evaporator 100 also has an integrated peripheral installation plate or flange 140 with which it can be mounted on a substrate 106. Known mounting methods can be used for mounting.

As described above, the present invention is related to a cooling arrangement for cooling a substrate such as a semiconductor arrangement, which cooling arrangement is implemented as a cold vapor refrigeration machine in whose refrigerating circuit are arranged a refrigerant compressor, a condenser for outputting heat to ambient air, the evaporator being preceded by a throttle valve for isenthalpic expansion of the refrigerant, and the evaporator being implemented as a heat sink for receiving heat from the substrate. The circular process of this cold vapor refrigeration machine is a counter-clockwise circular process, which is illustrated by way of example in FIG. 7.

FIG. 7 shows an exemplary flow diagram 700 of a method for cooling a substrate by means of a refrigerant according to one embodiment. The method 700 starts at step S710, where the refrigerant is compressed in a refrigerating circuit. Upon compression, the compressed refrigerant can be heated to a temperature t2 that is higher than the temperature of a coolant serving to cool it. By way of example, where ambient air is used as a coolant, the refrigerant can be heated, upon compression thereof, to a temperature t2 which is higher than the temperature $t_u$ of the ambient air. At step S720, the condensed refrigerant is subjected to an expansion step in order to reduce its pressure and temperature so that, after expansion, it is present as boiling liquid and as wet vapor. In the expansion step, the condensed refrigerant can be expanded isenthalpically. At step S740, boiling liquid and wet vapor are delivered to an evaporator that is in thermal contact with the substrate to be cooled. At step S750, refrigerant from the evaporator is subjected once again to the compression step, i.e. method 700 returns to step S710.

Numerous variants and modifications are of course possible within the scope of the present invention.

The invention claimed is:

1. A cooling apparatus adapted for cooling a heat-generating substrate by cold vapor refrigeration, comprising a refrigeration loop including:
   a refrigerant compressor (32),
   a condenser (44) for receiving refrigerant from said compressor and for outputting heat to ambient air, thereby cooling said refrigerant,
   a fan (20) arranged to pass said ambient air past said condenser (44),
   a throttle valve (62) for receiving cooled refrigerant from said condenser (44), and adapted to permit isenthalpic expansion of the refrigerant, an evaporator (60; 100) having a primary heat-transfer surface (104) formed of a highly heat-conductive material, adapted to receive refrigerant from said throttle valve (62), and thermally coupled to the heat-generating substrate (12), a common drive motor (42) adapted to drive both said compressor (32) and said fan (20), and a controller (54) adapted to receive a signal corresponding to refrigerant temperature, and to control said temperature by controlling a rotation speed of said fan (20).

2. A cooling apparatus adapted for cooling a heat-generating substrate by cold vapor refrigeration, comprising a refrigeration loop including:

a refrigerant compressor (32), a condenser (44) for receiving refrigerant from said compressor and for outputting heat to ambient air, thereby cooling said refrigerant, a fan (20) arranged to pass said ambient air past said condenser (44), a throttle valve (62) for receiving cooled refrigerant from said condenser (44), and adapted to permit isenthalpic expansion of the refrigerant, an evaporator (60; 100), adapted to receive refrigerant from said throttle valve (62), and thermally coupled to the heat-generating substrate (12), a common drive motor (42) adapted to drive both said compressor (32) and said fan (20), and a controller (54) adapted to receive a signal corresponding to refrigerant temperature, and to control said temperature by controlling a rotation speed of said fan (20);

wherein said compressor (32) and said fan (20) constitute a pair of driven units, and said motor (42) drives one of said driven units directly and drives the other of said driven units via a magnetic coupling.

3. The cooling apparatus of claim 2, wherein said drive motor (42), said fan (20) and said compressor (32) are commonly housed in a single module.

4. The cooling apparatus of claim 2, wherein said refrigeration loop is a counterclockwise circular process.

5. A cooling apparatus adapted for cooling a heat-generating substrate by cold vapor refrigeration, comprising a refrigeration loop including:

a refrigerant compressor (32), a condenser (44) for receiving refrigerant from said compressor and for outputting heat to ambient air, thereby cooling said refrigerant, a fan (20) arranged to pass said ambient air past said condenser (44), a throttle valve (62) for receiving cooled refrigerant from said condenser (44), and adapted to permit isenthalpic expansion of the refrigerant, an evaporator (60; 100), adapted to receive refrigerant from said throttle valve (62), and thermally coupled to the heat-generating substrate (12), a common drive motor (42) adapted to drive both said compressor (32) and said fan (20), and a controller (54) adapted to receive a signal corresponding to refrigerant temperature, and to control said temperature by controlling a rotation speed of said fan (20);

wherein said apparatus stages are dimensioned such that, and said controller is configured such that, at least some of said refrigerant undergoes phase changes between a vapor phase and a liquid phase.

6. The cooling apparatus of claim 5, wherein, during operation, refrigerant, in said evaporator (60; 60') stage, is present as a boiling liquid (52a) and as a saturated vapor (52d).

7. A cooling apparatus adapted for cooling a heat-generating substrate by cold vapor refrigeration, comprising a refrigeration loop including:

a refrigerant compressor (32), a condenser (44) for receiving refrigerant from said compressor and for outputting heat to ambient air, thereby cooling said refrigerant, a fan (20) arranged to pass said ambient air past said condenser (44), a throttle valve (62) for receiving cooled refrigerant from said condenser (44), and adapted to permit isenthalpic expansion of the refrigerant, an evaporator (60; 100), adapted to receive refrigerant from said throttle valve (62), and thermally coupled to the heat-generating substrate (12), a common drive motor (42) adapted to drive both said compressor (32) and said fan (20), and a controller (54) adapted to receive a signal corresponding to refrigerant temperature, and to control said temperature by controlling a rotation speed of said fan (20);

wherein said fan and said compressor are mounted in a common housing (40) molded of plastic material.

8. A cooling apparatus adapted for cooling a heat-generating substrate by cold vapor refrigeration, comprising a refrigeration loop including:

a refrigerant compressor (32), a condenser (44) for receiving refrigerant from said compressor and for outputting heat to ambient air, thereby cooling said refrigerant, a fan (20) arranged to pass said ambient air past said condenser (44), a throttle valve (62) for receiving cooled refrigerant from said condenser (44), and adapted to permit isenthalpic expansion of the refrigerant, an evaporator (60; 100), adapted to receive refrigerant from said throttle valve (62), and thermally coupled to the heat-generating substrate (12), a common drive motor (42) adapted to drive both said compressor (32) and said fan (20), and a controller (54) adapted to receive a signal corresponding to refrigerant temperature, and to control said temperature by controlling a rotation speed of said fan (20);

wherein said evaporator (60; 100) is configured as an impact plate.

9. The cooling apparatus of claim 8, wherein a nozzle (114) is formed at an entry point for refrigerant (52) entering said evaporator (100).

10. The cooling apparatus of claim 9, wherein said nozzle is configured as an orifice nozzle.

11. The cooling apparatus of claim 9, wherein said nozzle is configured as a slit nozzle.

12. The cooling apparatus of claim 9, wherein said nozzle is configured as a vena contracta to behave according to the Coanda effect.

13. A cooling apparatus adapted for cooling
a heat-generating substrate by cold vapor refrigeration,
comprising a refrigeration loop including:
- a refrigerant compressor (32),
- a condenser (44) for receiving refrigerant from said compressor and for outputting heat to ambient air, thereby cooling said refrigerant,
- a fan (20) arranged to pass said ambient air past said condenser (44),
- a throttle valve (62) for receiving cooled refrigerant from said condenser (44), and adapted to permit isenthalpic expansion of the refrigerant,
- an evaporator (60; 100), adapted to receive refrigerant from said throttle valve (62), and thermally coupled to the heat-generating substrate (12),
- a common drive motor (42) adapted to drive both said compressor (32) and said fan (20), and
- a controller (54) adapted to receive a signal corresponding to refrigerant temperature, and to control said temperature by controlling a rotation speed of said fan (20);
- wherein said evaporator (100) has a substrate-adjacent surface and a substrate-remote surface, and said substrate-remote surface defines a concave surface (114) for contact with said refrigerant.

14. The cooling apparatus of claim 13, wherein said concave surface is shaped substantially as a spherical shell.

15. The cooling apparatus of claim 13, wherein said concave surface is shaped as a rotation surface of a paraboloid.

16. The cooling apparatus of claim 13, wherein a plurality of mutually-spaced heat-transfer elements (116) are formed on said concave surface (114).

17. The cooling apparatus of claim 16, wherein said heat-transfer elements (116) are, at least partially, needle-shaped.

18. The cooling apparatus of claim 9, wherein, adjacent an entry point (114) for refrigerant entering said evaporator (100), at least one obstruction (124) is provided, to impede direct flow of refrigerant from an inlet (112) of said evaporator to an outlet (126) thereof.

19. A cooling apparatus adapted for cooling
a heat-generating substrate by cold vapor refrigeration,
comprising a refrigeration loop including:
- a refrigerant compressor (32),
- a condenser (44) for receiving refrigerant from said compressor and for outputting heat to ambient air, thereby cooling said refrigerant,
- a fan (20) arranged to pass said ambient air past said condenser (44),
- a throttle valve (62) for receiving cooled refrigerant from said condenser (44), and adapted to permit isenthalpic expansion of the refrigerant,
- an evaporator (60; 100), adapted to receive refrigerant from said throttle valve (62), and thermally coupled to the heat-generating substrate (12),
- a common drive motor (42) adapted to drive both said compressor (32) and said fan (20), and
- a controller (54) adapted to receive a signal corresponding to refrigerant temperature, and to control said temperature by controlling a rotation speed of said fan (20);
- wherein said evaporator is made of a highly heat-conductive material namely a metal selected from the group consisting of aluminum, aluminum alloys, copper, copper alloys, silver and silver alloys.

20. The cooling apparatus of claim 2, wherein said evaporator (100) comprises an assembly formed with a refrigerant inlet (112) and a refrigerant outlet (126).

21. A cooling apparatus adapted for cooling
a heat-generating substrate by cold vapor refrigeration,
comprising a refrigeration loop including:
- a refrigerant compressor (32),
- a condenser (44) for receiving refrigerant from said compressor and for outputting heat to ambient air, thereby cooling said refrigerant,
- a fan (20) arranged to pass said ambient air past said condenser (44),
- a throttle valve (62) for receiving cooled refrigerant from said condenser (44), and adapted to permit isenthalpic expansion of the refrigerant,
- an evaporator (60; 100), adapted to receive refrigerant from said throttle valve (62), and thermally coupled to the heat-generating substrate (12),
- a common drive motor (42) adapted to drive both said compressor (32) and said fan (20), and
- a controller (54) adapted to receive a signal corresponding to refrigerant temperature, and to control said temperature by controlling a rotation speed of said fan (20);
- wherein said evaporator (100) comprises a plurality of parts (102, 104) coupled fluid-tightly together.

22. The cooling apparatus of claim 21, further comprising a radial seal (134) fluid-tightly coupling said parts to each other.

23. The cooling apparatus of claim 21, further comprising a mounting flange (140) integrally formed with one of said evaporator parts.

24. A method of cooling a surface of a heat-generating electronic device, using a refrigeration loop, comprising the steps of:
- compressing a refrigerant in a compressor (32);
- feeding said refrigerant from said compressor (32) through a condenser (44) being cooled by a fan (20);
- subjecting said refrigerant from said condenser (44) to an expansion step to reduce its pressure and its temperature, until it is present as a boiling liquid and a wet vapor;
- applying said boiling liquid and wet vapor to a heat-transfer surface (114) in an evaporator (100) thermally coupled to said heat-generating electronic device; and
- returning refrigerant from said evaporator to said compressor (32);
- wherein said compressor (32) and said fan (20) rotate according to drive energy from a common motor (42), and wherein a temperature of said refrigerant is monitored and controlled (54) by controlling rotation speed of said common motor (42).

25. The method of claim 24, wherein
said step of subjecting said refrigerant to expansion comprises isenthalpically expanding said refrigerant.

26. The method of claim 24 wherein
said step of compressing said refrigerant comprises heating said refrigerant to a temperature ($t_2$) higher than a temperature of a medium to be used for cooling said refrigerant.

27. The method of claim 26, further comprising
using ambient air to cool said refrigerant, and said step of heating said refrigerant comprises heating said refrigerant to a temperature ($t_2$) warmer than a temperature ($t_u$) of said ambient air.

* * * * *